3,475,691

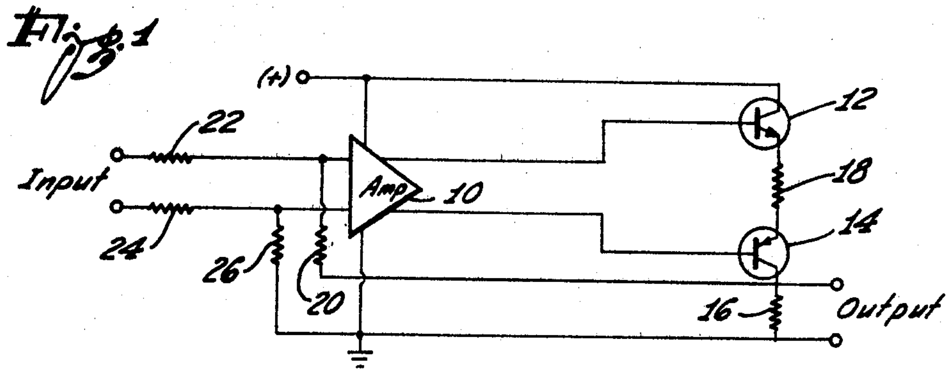
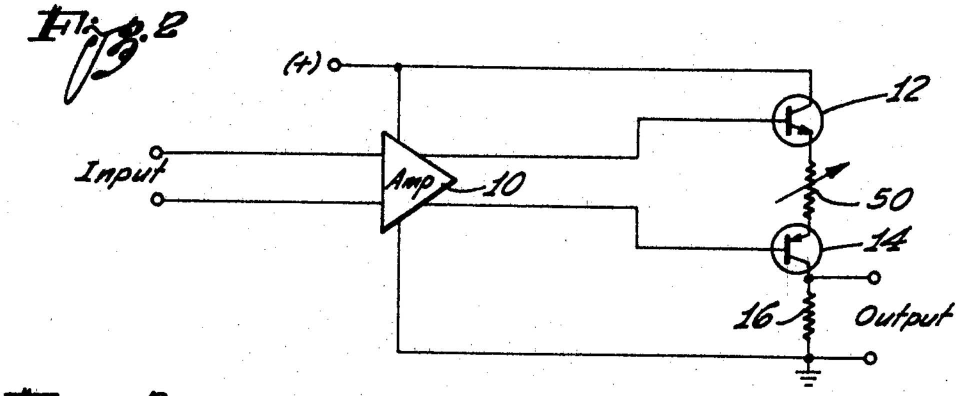
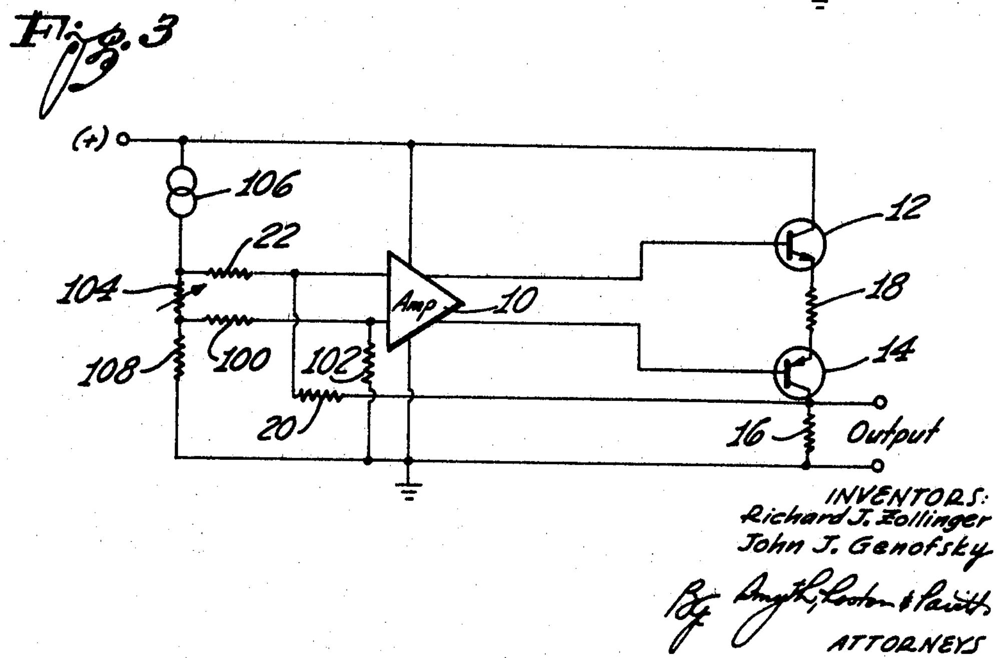
INVENTORS:
Richard J. Zollinger
John J. Genofsky
By [signature]
ATTORNEYS United States Patent Office 3,475,691
Patented Oct. 28, 1969

MEASUREMENT CIRCUIT INCLUDING DIFFERENTIAL AMPLIFIER AND SINGLE-ENDED OUTPUT

Richard J. Zollinger, Sierra Madre, and John J. Genofsky, La Crescenta, Calif., assignors, by mesne assignments, to Whittaker Corporation, Los Angeles, Calif.

Filed Oct. 17, 1966, Ser. No. 587,291
Int. Cl. H03f 3/68
U.S. Cl. 330—30 10 Claims

ABSTRACT OF THE DISCLOSURE

The present invention is directed to a measurement circuit which includes a variable impedance element responsive to a physical phenomenon coupled to the input of a differential amplifier. The output from the differential amplifier is converted to a single-ended output using a pair of complementary-type transistors. The invention also includes the use of a variable resistor within the complementary transistor structure to provide for a maximum output signal from the amplifier in accordance with particular values of the variable resistor. The invention also includes the use of an electrical circuit at the input of the differential amplifier and including feedback from the output of the single-ended output circuit to the input of the differential amplifier.

This invention relates to improvements in electronic circuitry. More specifically, this invention relates to an electrical circuit for converting a differential signal to a single-ended output signal. In particular, the invention relates to the conversion of a differential signal from a differential amplifier to a single-ended output signal wherein the single-ended output signal is proportional to the differential signal.

It is often desirable to provide amplification for relatively low-level DC signals. For example, certain types of measurement transducers such as pressure, temperature, strain, displacement, etc., transducers produce relatively low-level DC signals which must be amplified to provide a usable output signal. For example, it may be desirable to provide an output signal which has a range between zero and 5 volts.

The amplification of the low-level DC signals must be linear and, in addition, the amplification must be stable over varying temperature conditions. Unfortunately, single-ended DC amplifiers are inherently temperature sensitive so that the output of the amplifier varies in accordance with temperature. The ordinary single-ended DC amplifier, therefore, cannot be used to provide amplification of low-level DC measurement signals. The amplification of the DC measurement signals must be provided by a symmetrical dual type of amplifier wherein each half of the amplifier cancels the temperature effects of the other half of the amplifier. This type of symmetrical amplifier circuit is generally called a differential amplifier. Included within the structure of the present invention may be the use of a differential amplifier to provide amplification of low-level DC signals.

The use of differential amplifiers, while providing temperature stability, raises additional complications. For example, the input and output terminals of the ordinary differential amplifier have positive and negative leads, both above a reference potential such as ground, so that the signal through the differential amplifier is composed of a difference between the two voltage levels. It is, therefore, impossible with the ordinary differential amplifier to ground the negative input and output terminals to the reference potential such as ground with a single power supply.

The use of differential amplifiers in the past has also necessitated having the power supply isolated from the differential amplifier with a transformer or some other suitable means. A further problem which arises due to the use of conventional differential amplifiers is the inability to utilize a single reference potential such as ground for a plurality of information channels.

The present invention relates to an electrical circuit which eliminates the problems described above while still obtaining the advantages of differential amplifiers. One way in which to eliminate the above described problems is to provide an output circuit for the differential amplifier which produces a single-ended output signal. The use of such a single-ended output circuit eliminates the necessity of including all the isolation circuits described above and a common reference potential such as ground may be used throughout the entire electrical circuitry.

One of the major problems with the use of a conversion circuit to provide a single-ended output signal from a differential amplifier is to provide a linear single-ended output signal over a wide voltage range and, in addition, provide for the linear single-ended output signal at voltages close to zero volts. Prior art single-ended differential amplifier circuits with a single power supply could not provide for output signals close to zero with a proper linearity.

The present invention, therefore, relates to an electrical circuit which may be coupled to the output of a differential amplifier and which provides for a single-ended output signal proportional to the signal appearing at the output of the differential amplifier and wherein the single-ended output signal has a high degree of linearity from very low voltage values to the maximum voltage value. In addition, the use of the electrical circuit of the present invention eliminates the need to provide isolation between grounds so that all grounds may be tied in common without producing undesired effects within the circuit. Other advantages of the present invention are the elimination of a negative voltage supply for biasing since a single power supply may be used within the circuit. In addition, the overall circuit of the present invention including the differential amplifier and the output circuit still provide the major advantages of differential amplifiers since the overall circuit has excellent thermal stability and common mode rejection.

In addition to the major use of the present invention to provide a single-ended output from a differential amplifier, the present invention may also be adjusted to provide other uses. The circuit of the present invention may be adjusted so as to provide for a limiting of the output signal. For example, it may be desirable that the output signal from the amplifier be variable up to a particular maximum amount and then be limited or clamped at a value slightly above that maximum amount. Old methods of providing the limiting or clamping included the use of diodes such as Zener diodes.

The use of Zener diodes to provide the clamping has certain disadvantages. For example, the Zener diodes do not inherently provide for a sharp cutoff and produce undesirable effects on the output signal before the cutoff. Also, different Zener diodes are inconsistent in their characteristics and it is difficult to produce the same cutoff point in a plurality of circuits. Finally, Zener diodes exhibit voltage variations with changes in temperature. Due to the above-described conditions, it is difficult to provide for an accurate clamping point using a Zener diode.

The output circuit of the present invention provides for clamping an output signal in an efficient manner while eliminating the problems of the prior art explained above. The clamping of the output signal is accomplished in the present invention with a very sharp cutoff point, minimal temperature drift, a wide and simple adjustment of the clamping voltage.

Another use of the output circuit of the present invention in combination with a differential amplifier is to eliminate the normal bridge circuit which is usually used to derive a measurement signal. As indicated above, the differential amplifier is often used in conjunction with various transducers. Usually the transducer provides an output in response to some physical phenomenon and the transducer is connected in a bridge circuit so as to provide an output signal across the arms of the bridge. Since it is desired to provide a zero signal when there is a nominal condition for the physical phenomenon, the bridge circuit is balanced so as to provide for a minimal output at the nominal condition.

The present invention eliminates the use of the bridge circuit. The transducer which is usually a variable impedance element which has a nominal value may be connected directly across the input to the differential amplifier through a coupling circuit which is part of the circuitry of the present invention. Specifically, the present invention may include the input coupling circuit so as to provide for the proper feedback and balance through the differential amplifier and the coupling circuit may be adjusted so as to provide for a minimum output from the output coupling circuit when the variable impedance element is at its nominal value. The advantage of using a single variable impedance element instead of a full bridge circuit are the realization of a greater measurement signal from the variable impedance element since the losses in the bridge circuit are eliminated. The gain of the amplifier may, therefore, be lower, thereby increasing the stability of the amplifier.

As indicated above, the present invention may be used for various purposes, but generally the present invention includes an output circuit which has a pair of complementary transistors. The transistors each have a base, emitter and collector and the bases of the transistors are each individually connected to one of the output terminals from the differential amplifier. The collector of one of the transistors is electrically connected to a supply potential such as a positive supply voltage. The collector of the other one of the transistors is usually coupled through a load impedance such as a resistor to a reference potential such as ground. This ground may be the same ground which is used within the differential amplifier and the positive supply voltage may be the same supply voltage which is used within the differential amplifier.

The emitters of the transistors are electrically interconnected usually through an impedance element such as a resistor. The value of the resistor is such as to provide for the proper maximum output from the output circuit. The resistor between the emitters may be variable and an adjustment of this variable resistor provides for a clamping of the output voltage at a desired level.

The circuit of the present invention may also include a feedback from the single-ended output to one of the inputs to the differential amplifier. Other resistive elements may be included in series with the inputs to the differential amplifier and in parallel across the inputs to the differential amplifier so as to provide for the proper balancing of the inputs to the differential amplifier. Since the present invention may include this input coupling circuit, it is possible to use a single variable impedance element which is responsive to some physical phenomenon and to couple the single element directly across the input coupling circuit. The input coupling circuit may then be adjusted so that the single-ended output is minimal when the variable impedance element is at its nominal value. The use of the input coupling circuit to balance the value of the transducer is advantageous since it eliminates the use of a normal bridge circuit.

A clearer understanding of the present invention may be had with reference to the further description contained in this specification and in the drawings wherein:

FIGURE 1 is a first embodiment of the invention showing the general use of the output coupling circuit to provide a single-ended output from a differential amplifier;

FIGURE 2 is a second embodiment of the invention illustrating the use of the output coupling circuit to provide for a variable clamp on the output from the single-ended output circuit, and FIGURE 3 is a third embodiment of the invention showing the use of the output coupling circuit in combination with an input network so as to provide for the use of a single variable impedance transducer element.

In FIGURE 1 a first embodiment of the present invention is shown including a conventional differential amplifier 10. The differential amplifier 10 has a pair of input terminals and a pair of output terminals and appropriate connections within the differential amplifier are connected to a positive supply line and a reference potential such as ground. It is to be appreciated that the invention may be related to a conventional differential amplifier which uses a negative supply and the example shown is merely illustrative. The particular form of a differential amplifier may be of any conventional type but it should be noted that the differential amplifier may be tied directly to the reference potential such as ground.

The single-ended output circuit for the differential amplifier includes a pair of complementary transistors 12 and 14. Transistor 12 may be an NPN transistor and transistor 14 may be a PNP transistor. It is to be appreciated that the transistors may be reversed if the differential amplifier is of the type which uses a negative supply. The bases of the transistors 12 and 14 are each connected to one of the output terminals of the differential amplifier 10. The collector of transistors 12 is connected to the positive supply and the collector of transistor 14 is connected through a load resistor 16 to the reference potential such as ground. The output signal from the single-ended circuit is, therefore, taken across the load resistor 16.

The emitters of the transistors 12 and 14 are interconnected through a resistor 18. Feedback is applied to the input of the differential amplifier 10 through a resistor 20 from the output signal which appears across the resistor 26. A pair of resistors 22 and 24 are in series with the input terminals of the differential amplifier 10. Finally, a resistor 26 is connected between the resistor 24 and the reference potential such as ground.

As the input signal applied to the differential amplifier through the resistors 22 and 24 varies between zero and some maximum amount, the signal at the output terminals of the amplifer 10 also varies. For example, the input signal may vary between zero and 250 millivolts and the signals at the output terminals of the differential amplifier would each vary from a nominal value either upward or downward. For example, the signal at one output terminal may vary from 10 volts to 12½ volts while the signal at the other output terminal may vary from 10 volts to 7½ volts. In this way, the voltage difference between the output terminals of the differential amplifier approximates the voltage change at the input terminals of the differential amplifier, except amplified.

The signals from the output terminals of the differential amplifier are, of course, connected to the bases of the transistors 12 and 14. Transistor 12 operates as an emitter follower and transistor 14 operates as a low gain amplifier. The transistors 12 and 14 are connected together to produce a current flow through resistors 18 that is directly proportional to the differential amplifier output. The current through the resistor 18 is approximately the same as the current through the resistor 16 so that the output across the resistor 16 is directly proportional to the output from the differential amplifier. In addition, the resistors 20 and 22 define the amount of feedback which is used in the differential amplifier circuit of the present invention and the gain of the entire system is defined by the ratio of resistor 20 to resistor 22.

The use of the feedback provides for a relatively low output impedance which is desirable and, of course, the feedback increases the stability of the entire system. The resistors 24 and 26 are used as a simple voltage divider so as to balance the input to the differential amplifier 10.

Since the resistors 24 and 26 may be used as a simple voltage divider, the values of the resistors 24 and 26 may be adjusted to provide an offset in the output signal across the resistor 16 when the input signal is zero. This offset may be used to provide for a balancing in the system as will be explained later with reference to FIGURE 3.

FIGURE 2 shows a second embodiment of the invention and elements similar to those of FIGURE 1 are given similar reference characters. For example, FIGURE 2 includes a differential amplifier 10 and a pair of complementary transistors 12 and 14. In addition, FIGURE 2 includes an output load resistor 16. It is to be noted that FIGURE 2 does not illustrate the use of feedback such as provided for in FIGURE 1 but it is to be appreciated that such feedback may be used in the embodiment of FIGURE 2 if desired.

FIGURE 2 also includes a variable resistor 50 interconnecting the emitters of the complementary transistors 12 and 14. Although the resistor 50 is shown to be variable, it is to be appreciated that the resistor 50 may be chosen to have a particular fixed value. The embodiment of FIGURE 2 may be used to provide for an adjustable clamping of the output signal across the resistor 16. As indicated above with reference to FIGURE 1, as one of the signals on one of the output terminals from the differential amplifier goes in a positive direction, the other output signal goes in a negative direction. The voltage difference between the voltage across output terminals of the differential amplifiers develops a voltage across the resistor 50. In addition, the current flow through the resistor 16 is controlled by the voltage across resistor 50.

In the ordinary operation of transistors, the base and the emitter are approximately the same voltage potential. As the voltage output across the resistor 16 increases, the voltage on the emitter of the transistor 14 decreases. As the voltage output continues to rise across the resistor 16 there will be some point at which the emitter and the collector of transistor 14 will be at an equal potential thereby saturating the transistor 14. Since a transistor clamps automatically at saturation, the output signal across the resistor 16 is, therefore, clamped very effectively. The level at which the output signal may be clamped is easily adjusted by varying the resistance of resistor 50. The value of the resistor 50, therefore, controls the maximum output voltage across the resistor 16.

The clamping of the output signal occurs at a very sharp point so that the output signal increases linearly until the clamping point is reached and then the clamping occurs very suddenly due to the saturation of the transistor. The clamping circuit of FIGURE 2 does not depend on the use of Zener diodes as explained above and, therefore, is not dependent upon the temperature characteristics of the Zener diodes. In addition, the clamping voltage may be very easily varied by adjusting the value of the resistor 50.

FIGURE 3 illustrates a third embodiment of the invention and specifically illustrates the use of the invention with an input signal produced from a single variable impedance element. In FIGURE 3 elements similar to those of FIGURE 1 are given similar reference characters and the embodiment of FIGURE 3 includes a differential amplifier 10, a pair of complementary transistors 12 and 14, an output load resistor 16, a resistor 18 interconnecting the emitters of the transistors 12 and 14 and a feedback circuit including resistors 20 and 22. A pair of complementary feedback resistors 100 and 102 form a voltage divider circuit which is essentially similar to the voltage divider circuit formed by the resistors 24 and 26 of FIGURE 1.

Usually the resistors 100 and 102 would be adjusted so as to provide for balanced input to the differential amplifier. In the embodiment of FIGURE 3, however, the various input resistors 22, 100 and 102 are adjusted to provide for an unbalance in the input to compensate for an unbalance in the input. The input to the differential amplifier 10 in FIGURE 3 is derived from a variable impedance element 104 which may be, for example, a variable resistor. The variable resistor 104 actually represents a sensor or transducer element which provides for variations in resistance in accordance with variations of a physical phenomenon. For example, the variation of resistance of the resistor 104 may represent a change in temperature, pressure, etc.

A constant current source 106 is connected between the variable resistor 104 and the positive supply voltage. A resistor 108 biases the resistor 104. The constant current source produces a constant current through the variable resistor 104 and variations in resistance of the resistor 104 produce a variable boltage across the resistor 104. Since the resistor 104 has a nominal value there is always some nominal voltage produced across the resistor 104. This nominal voltage actually represents the zero condition for the physical phenomenon. It would be desirable to produce a minimal output signal across the resistor 16 when the resistor 104 is at its nominal value. The minimal output signal may be accomplished by varying the values of input coupling resistors so as to balance the input to the differential amplifier 10 for the nominal value of the variable resistance 104. For example, the resistor 22 may be varied to provide for the balanced input to the differential amplifier. However, preferably the resistor 20 is varied to produce the same result since its variation does not affect the temperature characteristics of the amplifier input.

The use of the single variable impedance element 104 as the input source is advantageous since it eliminates the use of the ordinary bridge input circuit. The bridge input circuit is used so as to provide for a balanced input when the variable impedance element is at its nominal impedance value. Unfortunately, the use of the bridge circuit requires additional resistance elements and reduces the overall signal level. The use of the embodiment of FIGURE 3, which includes an input coupling network which may be adjusted to balance out the nominal value of the variable impedance element, allows for the elimination of the additional resistors in the bridge circuit and increases the input signal level. The higher input signal level reduces the gain necessary in the amplifier circuit. The reduction in gain is desirable since it increases the stability of the amplifier circuit.

As can be seen from the above description, the present invention relates to a single-ended output circuit for a differential amplifier. The invention may be used to provide for the single-ended output from the differential amplifier with different types of input signals, for example, with measurement signals. In addition, the output circuit may be adjusted so as to provide for an effective clamping of the output signal at a desired maximum level. Also, the input to the differential amplifier may be simplified using the present invention since the normal bridge measurement circuits may be eliminated.

Although the invention has been explained with reference to particular embodiments, it is to be appreciated that various adaptions and modifications may be made. The invention, therefore, is only limited by the appended claims.

What is claimed is:

1. An electrical circuit, including a differential amplifier including a pair of input terminals and a pair of output terminals, a supply potential and a reference potential having a fixed difference of potential, a pair of complementary transistors each having a base, emitter and collector and with the base of each transistor electrically connected to one of the pair of output terminals of the differential amplifier and with the emitters of each transistor electrically interconnected and with the collector of one transistor electrically connected to the supply potential and with the collector of the other transistor electrically interconnected through an electrical load to the reference potential, and an electrical network coupled to the input terminals of the differential amplifier to balance the input to the differential amplifier and including a feedback path from the collector of the other transistor to one of the input terminals.

2. The electrical circuit of claim 1 wherein the electrical interconnection between the emitters of the pair of transistors includes an electrical resistor.

3. In a measurement circuit for providing a measurement of a physical phenomenon, a single-ended output circuit for use with a differential amplifier having a pair of input terminals and a pair of output terminals, including a variable impedance element responsive to the physical phenomenon for providing changes in the impedance in accordance with changes in the physical phenomenon and with the variable impedance element coupled to the input terminals of the differential amplifier to produce a difference signal between the pair of output terminals of the differential amplifier, a first supply potential having a first particular value, a second reference potential having a second particular value and with a fixed difference between the first and second particular values, an electrical load, a first transistor having a base, emitter and collector and with the base electrically interconnected to a first one of the pair of output terminals of the differential amplifier and with the collector electrically interconnected with the first supply potential, and a second transistor having a base, emitter and collector and with the second transistor complementary in relation to the first transistor and with the base of the second transistor electrically interconnected to a second one of the pair of output terminals of the differential amplifier and with the emitter electrically interconnected with the emitter of the first transistor and with the collector electrically interconnected through the electrical load to the second reference potential to produce a single-ended output signal across the electrical load in accordance with a difference signal between the pair of output terminals of the differential amplifier.

4. The circuit of claim 3 wherein the electrical interconnection between the emitters of the first and second transistors includes a resistor and wherein the current through the resistor is substantially proportional to the difference signal between the pair of output terminals of the differential amplifier.

5. The circuit of claim 3 additionally including a feedback network electrically connected to both input terminals of the differential amplifier.

6. The circuit of claim 5 wherein the feedback network includes a first resistor in series with one of the input terminals of the differential amplifier, a second resistor in series with the other of the input terminals of the differential amplifier, a third resistor electrically interconnected between the one input terminal of the differential amplifier and the second reference potential, and a fourth resistor electrically interconnected between the collector of the second transistor and the other of the input terminals of the differential amplifier.

7. An amplifier limiting circuit, including a differential amplifier having a pair of output terminals, a first supply potential, a second reference potential, an adjustable electrical impedance, a pair of complementary transistors each having a base, emitter and collector, the bases of the transistors electrically connected to the pair of output terminals, the collectors of the transistors electrically connected to the first supply potential and the second reference potential, and the emitters of the transistors electrically interconnected through the adjustable electrical impedance and with the electrical impedance adjusted to vary the maximum output signal from the amplifier limiting circuit at a predetermined level in accordance with the adjustment of the electrical impedance.

8. An electrical measurement circuit, including a differential amplifier having a pair of input terminals and a pair of output terminals, a pair of complementary transistors each having a base electrically connected to one of the pair of output terminals of the differential amplifier and with the complementary transistors having emitters electrically interconnected and with a single-ended output signal produced at a collector of one of the complementary transistors, a variable impedance element having a nominal value and with the variable impedance element operatively coupled to provide a measurement of a physical phenomenon and having changes in impedance from the nominal value in accordance with changes of the physical phenomenon, a constant energy source electrically connected to the variable impedance to supply energy to the variable impedance to produce a variable measurement signal from the variable impedance in accordance with the changes in impedance and having a minimum measurement signal in accordance with the nominal value, and an electrical network electrically connected to the variable impedance and to the pair of input terminals of the differential amplifier to couple the variable impedance to the pair of input terminals and with the electrical network having values to minimize the single-ended output signal when the variable impedance element has the nominal value.

9. The electrical circuit of claim 8 wherein the variable impedance element is a single resistive element.

10. The electrical circuit of claim 8 wherein the electrical network is a voltage network for balancing the input to the input terminals of the differential amplifier when the variable impedance element has the nominal value.

References Cited

UNITED STATES PATENTS

| | | | |
|---|---|---|---|
| 3,195,018 | 7/1965 | Giger | 330—13 X |
| 3,370,245 | 2/1968 | Royce et al. | 330—30 X |

ROY LAKE, Primary Examiner

L. J. DAHL, Assistant Examiner

U.S. Cl. X.R.

330—13, 26